United States Patent [19]

DeBalko et al.

[11] Patent Number: 5,442,519
[45] Date of Patent: Aug. 15, 1995

[54] DEVICE INCLUDING A MAINTENANCE TERMINATION UNIT AND PROTECTOR

[75] Inventors: George A. DeBalko, Township of Washington, Morris County; Rajendra S. Rana, Township of Franklin, Somerset County, both of N.J.

[73] Assignee: AT&T Corp., Murray Hill, N.J.

[21] Appl. No.: 175,017

[22] Filed: Dec. 29, 1993

[51] Int. Cl.6 ............................................. H05K 1/11
[52] U.S. Cl. ................................. 361/784; 361/772; 361/776; 361/791; 439/65
[58] Field of Search ........................ 361/784–786, 361/788, 790–791, 803, 760–761, 772, 776, 736, 743; 174/260–261, 263; 439/55, 65

[56] References Cited

U.S. PATENT DOCUMENTS

| | | |
|---|---|---|
| 4,262,317 | 4/1981 | Baumbach . |
| 4,396,809 | 8/1983 | Brunssen . |
| 4,424,546 | 1/1984 | Smith ................... 361/119 |
| 4,434,449 | 2/1984 | Dickey ................... 361/124 |
| 4,796,150 | 1/1989 | Dickey et al. . |
| 4,827,504 | 5/1989 | Collins et al. . |
| 5,008,770 | 4/1991 | Hilland . |
| 5,175,662 | 12/1992 | DeBalko et al. . |

*Primary Examiner*—Bot L. Ledynh
*Attorney, Agent, or Firm*—Lester H. Birnbaum

[57] ABSTRACT

Disclosed is a device and method of manufacture which provides a maintenance termination unit (MTU) and surge protector in a single 5-pin package. The components for both the MTU and surge protector are formed on a single printed circuit board separated by a groove but electrically connected by a plurality of wires. After wave soldering the contacts on the board, the board is broken apart while maintaining the electrical connection, and the resulting structure is mounted in a 5-pin package.

6 Claims, 3 Drawing Sheets

DEVICE INCLUDING A MAINTENANCE TERMINATION UNIT AND PROTECTOR

BACKGROUND OF THE INVENTION

This invention relates to telecommunications equipment.

Maintenance termination units (MTUs) are utilized in telecommunications equipment to disconnect the customer from the network in order to determine if any problems are on the customer side or network side of the equipment (see, e.g., U.S. Pat. No. 4,396,809 issued to Brunssen). Solid state protectors are used to short incoming signals to ground when excess current or voltage appears on the line (see, e.g., U.S. Pat. No. 4,796,510 issued to Dickey et al.). Usually, the MTU and protector are mounted in separate positions within an enclosure on the side of a customer's house (see, e.g., U.S. Pat. No. 4,827,504 issued to Collins et al.).

In order to reduce the overall size and cost of telecommunications equipment, it has been proposed to combine both the MTU and protector into a single package. U.S. Pat. No. 5,175,662 issued to DeBalko et al. discloses such a package where a surge protector module and a circuit board including the MTU are inserted into an array of spring contacts formed on the base of a 5-pin package.

It is desirable to provide an alternative design for combining an MTU and protector, as well as a convenient and economical method for manufacturing such a device.

SUMMARY OF THE INVENTION

In accordance with one aspect, the invention is a device comprising a base member with a plurality of conductive pins extending therefrom. A first printed circuit board including a protector unit is mounted on a major surface of the base member and electrically connected to the pins. A second printed circuit board including a maintenance termination unit is mounted to the base member essentially orthogonal to the first board and electrically connected thereto by means of a plurality of wires.

In accordance with a further aspect, the invention is a method for fabricating a device including the step of forming a protector unit and a maintenance termination unit on separate portions of a printed circuit board. The two units are electrically connected by a plurality of wires. After soldering of contacts on the board, the two portions are separated while maintaining the electrical connection between the two units. The two portions are then mounted in an essentially orthogonal orientation to a base member including a plurality of conductive pins extending therefrom so that the units are electrically connected to the pins.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
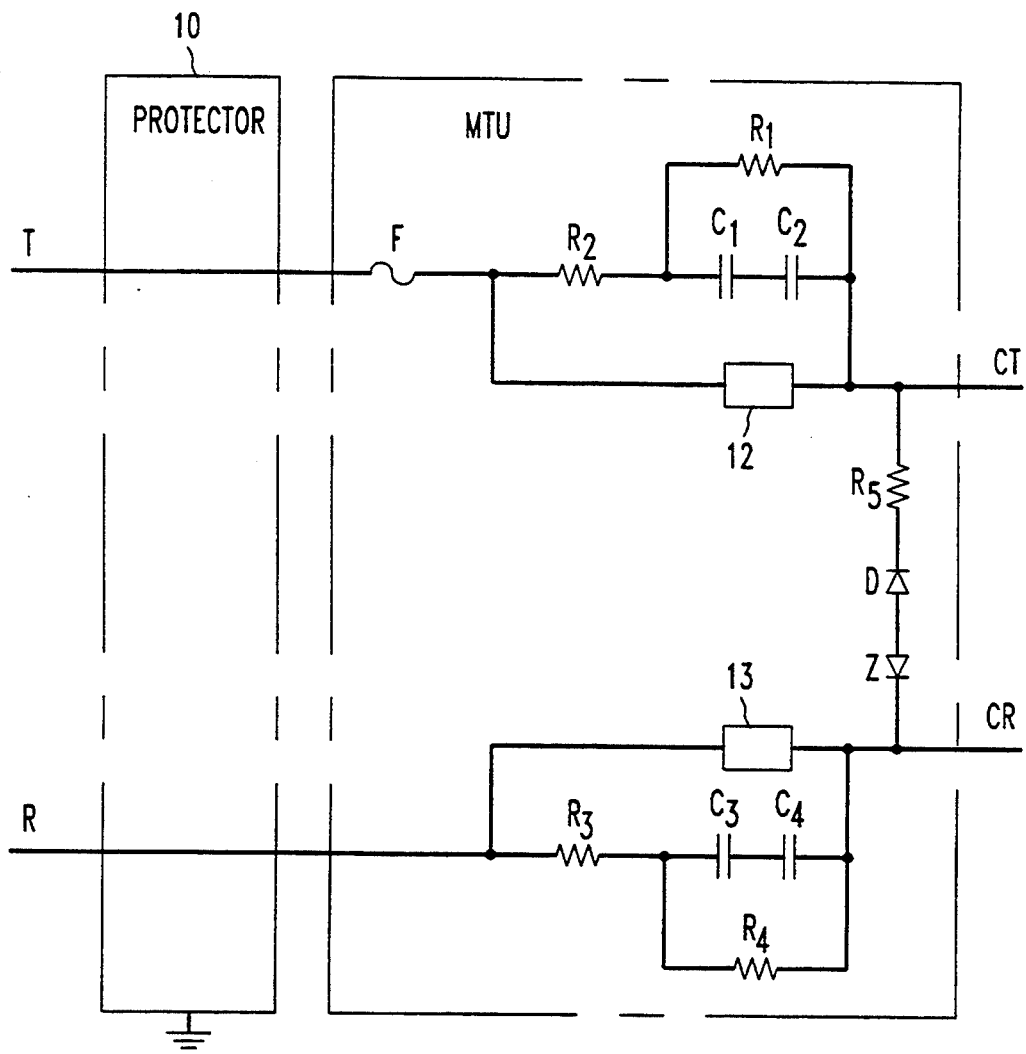
FIG. 1 illustrates a circuit diagram for a combination of protector unit and maintenance termination unit in accordance with an embodiment of the invention.

A combined MTU and protector are shown in the schematic illustration of FIG. 1. Telephone communications are provided to the customer from a central office (not shown) through a pair of conductors designated T (for tip) and R (for ring). A surge protector module is coupled between the T and R conductors and ground. The module is illustrated as a box 10, and can include solid state, gas tube or carbon block devices. During normal operation, the module will act as an open circuit to any signals on the T and R conductors. However, if the voltage or current on the conductors should reach a threshold value, for example, due to a lightning strike, an induced current from nearby power lines or inadvertent power line contact, the module components will become conducting and short the signals to a ground connection.

It will be appreciated that the surge protector module shown is intended to be a generalization of typical modules available in the commercial market. One particular example, described in more detail in U.S. Pat. No. 4,796,150 issued to Dickey et al. which is incorporated by reference herein, includes a solid state surge arrestor and a plurality of steering diodes. The surge arrestor itself is a single chip including a silicon controlled rectifier and a zener diode.

Conductor T is coupled through a fuse F internal to the MTU. The MTU includes a pair of semiconductor chips, one (12) coupled in series with conductor T and the other (13) coupled in series with conductor R. Each chip includes a bilateral switch, such as a triac, and appropriate steering diodes, transistors, zener diodes and resistors for biasing the switch. (For more details on the components of an MTU, see, e.g., U.S. Pat. No. 4,396,809 issued to Brunssen.) Resistors $R_1$, $R_2$ and capacitors $C_1$, $C_2$ provide the appropriate gate current to the triac in chip 12, among other functions. Resistors $R_3$, $R_4$ and capacitors $C_3$, $C_4$ provide a similar function for the triac in chip 13.

The chips 12 and 13 are coupled to the conductors, CT and CR, which are coupled to the customer's phone. Coupled between conductors CT and CR, on the customer side of switches 12 and 13, is a distinctive termination comprising a series connection of a resistor, $R_5$, a diode, D, and zener diode, Z, which diodes are oppositely disposed. This termination provides a unique signature indicating to the central office that an MTU is installed (see U.S. Pat. No. 4,529,847 issued to DeBalko). During normal operation, the voltage on conductors T and R and current flowing through said chips 12 and 13 is sufficient to close the normally open switches 12 and 13 in order to connect the customer on conductors CT and CR. If a fault is detected, the central office can apply a DC voltage which is insufficient to close the switches and thereby disconnect the customer. If the fault persists, the defect is in the network rather than in the customer premises equipment.

Figure 2:
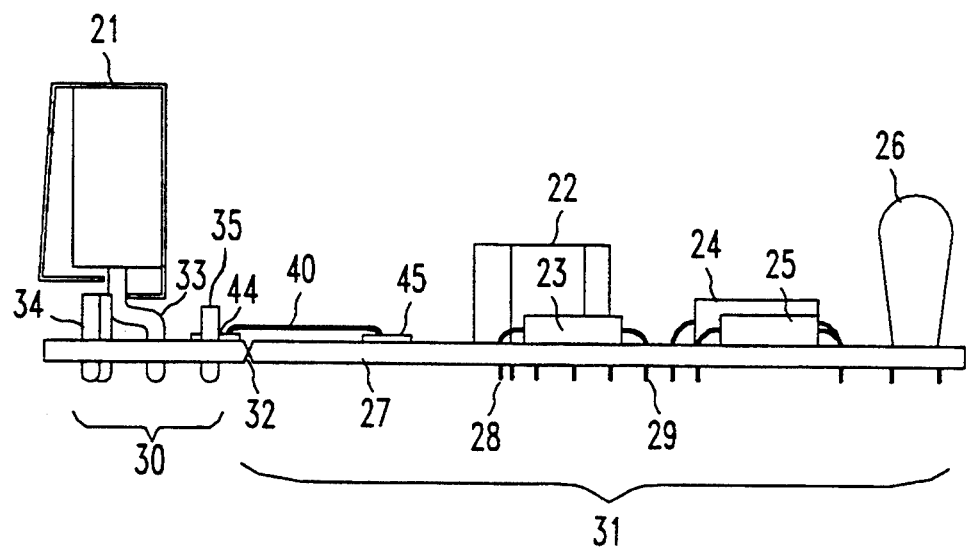
FIGS. 2-3 are side views of a portion of a device in accordance with an embodiment of the invention at different stages of fabrication.

FIG. 2 illustrates a portion of the combined protector-MTU device during one stage of fabrication. The protector module 21 and the various components of the MTU circuit, e.g., 22-26, are mounted on a major surface of a standard printed circuit board 27. The components and module are mounted by standard through-hole techniques so that the component leads, e.g., 28 and 29, extend through the opposite major surface of the board 27.

The circuit board 27 is divided into two portions, 30 and 31, by a "V" groove, 32, which runs the full width on top and bottom of the board so that the protector module 21 occupies one portion and the MTU occupies the other portion of the board. In the protector portion 30, the protector ground lead 33 is inserted through a hole in the board. Also, four conductive terminals 34–37 (see also FIG. 4) are press-lit into holes in the board near the corners of the protector portion 30.

The protector and MTU portions are electrically connected by a plurality of wires 40–43 which are bonded to corresponding pads (e.g., 44 and 45) on the two portions. In this example, four wires are through-hole inserted between corresponding pads and subsequently wave soldered, with wires 41 and 42 providing the connection from the protector to the MTU and wires 40 and 43 providing the connection from the MTU to the customer tip and customer ring (CT and CR of FIG. 1 ). The pads, e.g., 44 and 45, are electrically coupled to appropriate terminals or components by conductive paths, e.g., 46 and 47, deposited on the board 27 (see FIG. 4). The pads and conductive paths can be the standard type formed on printed circuit boards.

Figure 3:
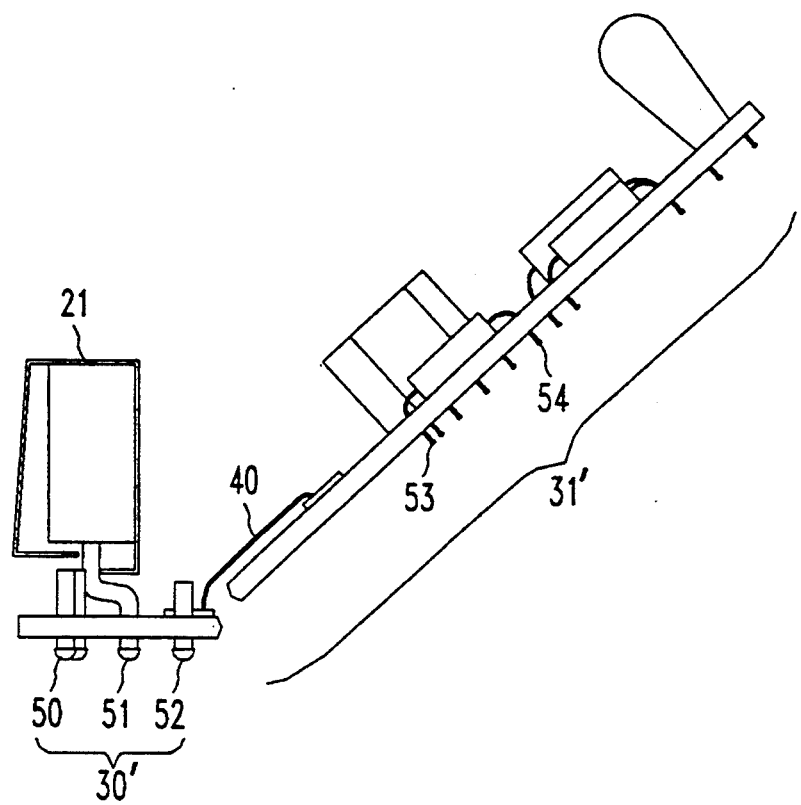

The circuit board 27 with the components mounted thereon is subject to a soldering such as by a standard wave-solder operation in order to form solder, e.g., 50–54 of FIG. 3, on the terminals and leads extending from the bottom surface of the board. Typically, the solder would be tin-lead applied at standard wave solder temperatures. After the solder cools, as also illustrated in FIG. 3, the board 27 is broken apart at the groove 32 in order to form physically separate boards 30' and 31' from the portions 30 and 31. The two boards 30' and 31' remain electrically connected by the wires 40–43.

Figure 4:
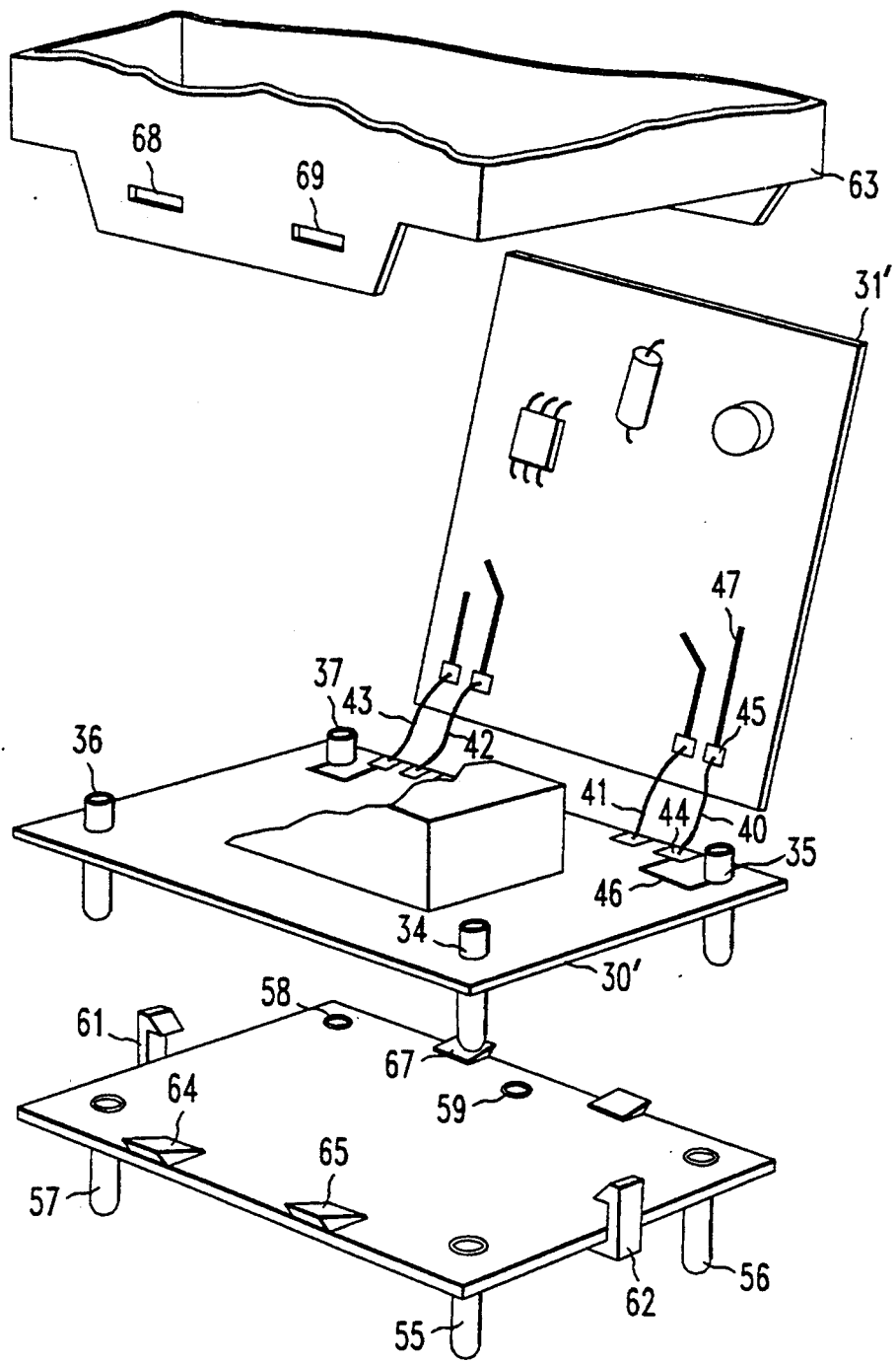
FIG. 4 is an exploded perspective view of a device in accordance with an embodiment of the invention.

As further illustrated in FIG. 4, the MTU board 31' is rotated so as to be essentially orthogonal to the protector portion 30'. The terminals 34–37 in the protector portion and the ground lead 33 are inserted into corresponding hollow conductive pins 55–59 which extend from a base member 60. The base member 60 is typically made of a plastic material and the pins are made of copper alloy. Pins 55 and 57 correspond to the ring (R) and tip (T) connections, respectively, and pins 56 and 58 correspond to the customer ring (CR) and customer tip (CT) connections, respectively, of the circuit of FIG. 1. Once the terminals 34–37 and ground lead 33 are inserted in the pins, the structure can be heated to reflow the solder, e.g., 50 and 52, in order to bond the terminals and lead to the pins and ensure electrical connection therebetween. An alternative bonding can be produced by mechanical spring tension between the board 30' and base 60. This can be accomplished with a pair of latches 61 and 62 provided on the sides of the base member in order to mechanically engage and hold under spring tension the sides of the protector board 30'.

After board 30' is mounted to base member 60, a cover 63 is inserted over the two boards, 30' and 31' and attached to the base member by four tabs 64–67 and matching cover holes, e.g., 68 and 69. The dimensions of the cover and the MTU components are such that the MTU portion 31' will remain fixed in its position orthogonal to protector portion 30'. Alternatively, grooves or railings (not shown) could be provided on the side walls of the cover with the board edges inserted therein to fix the position of the MTU portion 31'.

Various modifications of the invention will become apparent to those skilled in the art. All such variations which basically rely on the teachings through which the invention has advanced the art are properly considered within the scope of the invention.

We claim:

1. A device comprising:
   a base member with a plurality of conductive pins extending therefrom;
   a first printed circuit board including a protector unit mounted thereon, said first board being mounted to a major surface of the base member and electrically connected to the pins; and
   a second printed circuit board including a maintenance termination unit mounted thereon, said second board being mounted to the base member in a position essentially orthogonal to the first board and electrically connected thereto by means of a plurality of wires.

2. The device according to claim 1 wherein the conductive pins are hollow, and the first board includes terminals extending therethrough which are inserted into the pins.

3. The device according to claim 2 wherein the first board also includes a ground lead extending from the protector unit into a corresponding hollow pin.

4. The device according to claim 1 wherein the base member further includes latches which mechanically engage the first board.

5. The device according to claim 1 wherein the wires are bonded to conductive pads on both boards.

6. The device according to claim 1 wherein at least some of the wires are directly connected to terminals which extend through the first board.

* * * * *